US009741817B2

(12) United States Patent
Lisiansky et al.

(10) Patent No.: US 9,741,817 B2
(45) Date of Patent: Aug. 22, 2017

(54) METHOD FOR MANUFACTURING A TRENCH METAL INSULATOR METAL CAPACITOR

(71) Applicant: Tower Semiconductor Ltd., Migdal Haemek (IL)

(72) Inventors: Michael Lisiansky, Afula (IL); Amos Fenigstein, Haifa (IL); Yakov Roizin, Afula (IL); Hironori Matsuyoshi, Hyogo (JP); Toshiaki Ohmi, Hyogo (JP)

(73) Assignee: TOWER SEMICONDUCTOR LTD., Migdal Haemek (IL)

( * ) Notice: Subject to any disclaimer, the term of this patent is extended or adjusted under 35 U.S.C. 154(b) by 0 days.

(21) Appl. No.: 15/002,420

(22) Filed: Jan. 21, 2016

(65) Prior Publication Data

US 2017/0213896 A1    Jul. 27, 2017

(51) Int. Cl.
   *H01L 21/76*      (2006.01)
   *H01L 29/66*      (2006.01)
   *H01L 21/311*     (2006.01)
   *H01L 21/3105*    (2006.01)
   *H01L 21/321*     (2006.01)
   (Continued)

(52) U.S. Cl.
   CPC .. *H01L 29/66181* (2013.01); *H01L 21/28079* (2013.01); *H01L 21/28088* (2013.01); *H01L 21/31056* (2013.01); *H01L 21/31111* (2013.01); *H01L 21/3212* (2013.01); *H01L 21/76224* (2013.01); *H01L 21/76877* (2013.01)

(58) Field of Classification Search
   None
   See application file for complete search history.

(56) References Cited

U.S. PATENT DOCUMENTS

| 6,436,787 B1* | 8/2002 | Shih | H01L 28/55 |
| | | | 257/E21.009 |
| 6,528,366 B1* | 3/2003 | Tu | H01L 28/91 |
| | | | 257/E21.016 |

(Continued)

*Primary Examiner* — David E Graybill
(74) *Attorney, Agent, or Firm* — Reches Patents

(57) ABSTRACT

A method for manufacturing a metal insulator metal (MIM) trench capacitor, the method may include forming a cavity in an Intermetal Dielectric stack, wherein a bottom of the cavity exposes a lower metal layer; wherein the Intermetal Dielectric stack comprises a top dielectric layer; depositing a first metal layer on a bottom of a cavity and on sidewalls of the cavity; depositing a sacrificial layer over the first metal layer; filling the cavity with a filling material; removing, by a planarization process, a portion of the sacrificial layer positioned above the top dielectric layer and a portion of the first metal layer positioned above the top dielectric layer to expose an upper portion of the sacrificial layer and an upper portion of the first metal layer; forming a recess by removing the upper portion of the sacrificial layer and the upper portion the first metal layer while using the filling material as a mask; removing the filling material by a first removal process that is selective to the sacrificial layer and to the first metal layer; removing the sacrificial layer by a second removal process that is less aggressive than the first removal process; fabricating an insulator layer on the first metal layer; and depositing a second metal layer on the insulator layer.

15 Claims, 20 Drawing Sheets

(51) Int. Cl.
*H01L 21/762* (2006.01)
*H01L 21/768* (2006.01)
*H01L 21/28* (2006.01)

(56) References Cited

U.S. PATENT DOCUMENTS

| | | | | |
|---|---|---|---|---|
| 7,224,014 B2* | 5/2007 | Ichimura | H01L 28/40 | 257/301 |
| 7,351,634 B2* | 4/2008 | Su | H01L 27/1087 | 257/E27.092 |
| 7,745,333 B2* | 6/2010 | Lai | C23C 16/0281 | 257/E21.17 |
| 7,927,959 B2* | 4/2011 | Keating | H01G 4/012 | 257/E21.02 |
| 8,138,036 B2* | 3/2012 | Andry | H01L 21/76898 | 257/E21.545 |
| 8,637,937 B2* | 1/2014 | Andry | H01L 21/76898 | 257/382 |
| 8,669,618 B2* | 3/2014 | Fu | H01L 21/28088 | 257/368 |
| 8,735,251 B2* | 5/2014 | Andry | H01L 21/76898 | 438/280 |
| 8,766,355 B2* | 7/2014 | Lee | H01L 21/76232 | 257/330 |
| 8,791,009 B2* | 7/2014 | Farooq | H01L 21/76898 | 257/E23.067 |
| 8,993,398 B1* | 3/2015 | Sutardja | H01L 21/76802 | 438/258 |
| 9,230,864 B1* | 1/2016 | Lu | H01L 29/7831 | |
| 9,236,296 B2* | 1/2016 | Hong | H01L 21/32139 | |
| 2005/0191820 A1* | 9/2005 | Tu | H01L 21/32139 | 438/396 |
| 2006/0163640 A1* | 7/2006 | Park | H01L 23/5223 | 257/306 |
| 2007/0173012 A1* | 7/2007 | Aoki | H01L 21/76838 | 438/238 |
| 2007/0275523 A1* | 11/2007 | Su | H01L 27/1087 | 438/238 |
| 2008/0237869 A1* | 10/2008 | Li | H01L 21/76843 | 257/758 |
| 2009/0200618 A1* | 8/2009 | Boescke | H01L 21/28079 | 257/407 |
| 2010/0032764 A1* | 2/2010 | Andry | H01L 21/76898 | 257/369 |
| 2010/0176083 A1* | 7/2010 | Lee | H01L 21/31053 | 216/13 |
| 2011/0314669 A1* | 12/2011 | Stamper | B81C 1/00365 | 29/846 |
| 2011/0315528 A1* | 12/2011 | Herrin | B81C 1/00365 | 200/181 |
| 2012/0132967 A1* | 5/2012 | Andry | H01L 21/76898 | 257/288 |
| 2012/0264285 A1* | 10/2012 | Rachmady | H01L 21/28088 | 438/592 |
| 2012/0313178 A1* | 12/2012 | Liao | H01L 29/66545 | 257/368 |
| 2013/0071977 A1* | 3/2013 | Scheiper | H01L 21/76224 | 438/299 |
| 2013/0099307 A1* | 4/2013 | Tseng | H01L 21/28088 | 257/330 |
| 2014/0002976 A1* | 1/2014 | Brain | H01L 27/10852 | 361/679.02 |
| 2014/0094007 A1* | 4/2014 | Andry | H01L 21/76898 | 438/197 |
| 2015/0001669 A1* | 1/2015 | Chou | H01L 21/76224 | 257/506 |
| 2015/0123216 A1* | 5/2015 | Konduparthi | H01L 21/283 | 257/412 |
| 2016/0049495 A1* | 2/2016 | Trevino | H01L 29/66545 | 257/410 |
| 2016/0163601 A1* | 6/2016 | Xie | H01L 21/28088 | 257/392 |
| 2016/0343721 A1* | 11/2016 | Briggs | H01L 29/4236 | |
| 2016/0358954 A1* | 12/2016 | Hoyos | H01L 27/13 | |

* cited by examiner

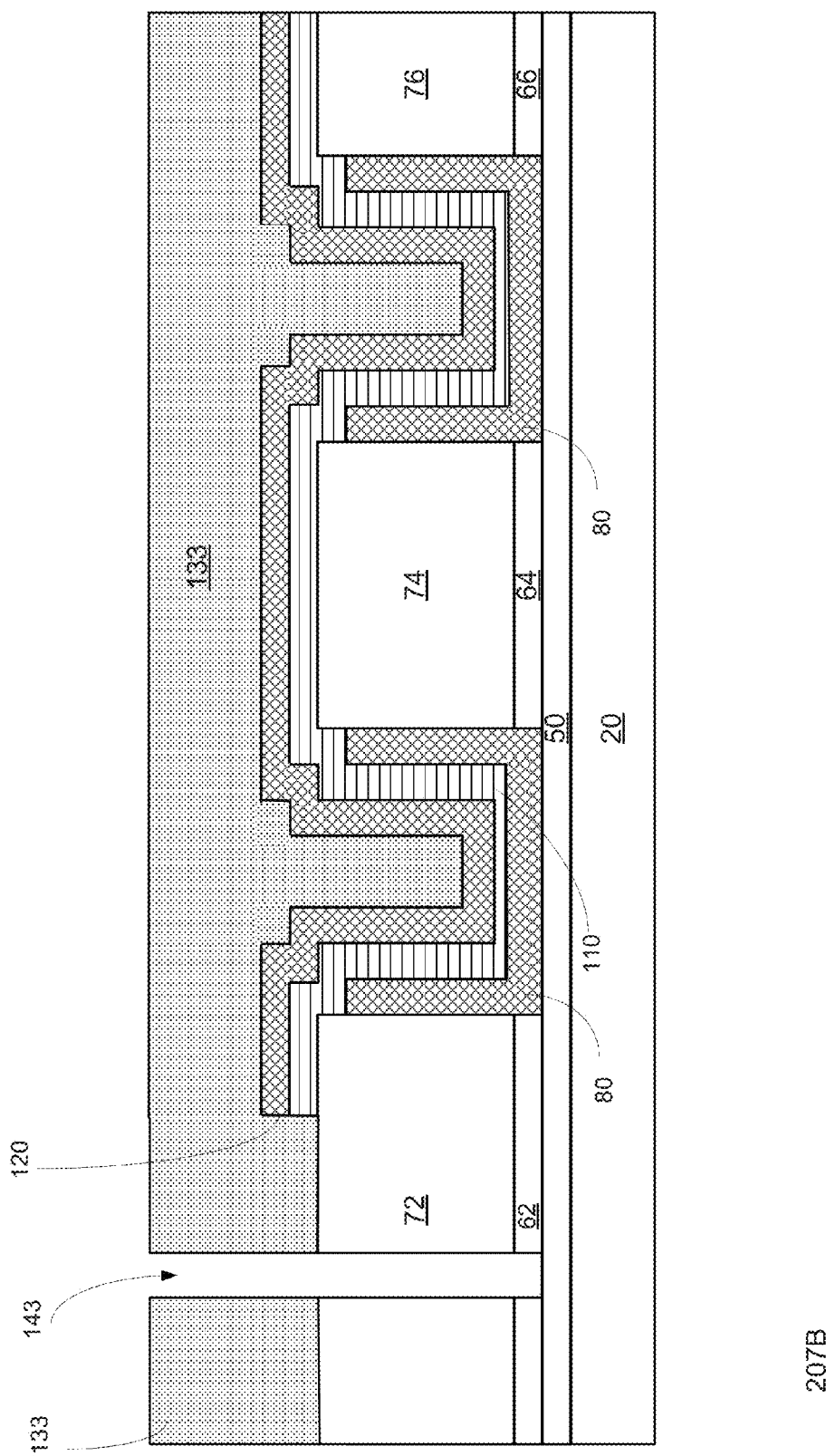

METHOD FOR MANUFACTURING A TRENCH METAL INSULATOR METAL CAPACITOR

BACKGROUND OF THE INVENTION

Metal insulator metal (MIM) capacitors are made of a bottom metal layer and an upper metal layer and an insulator layer that is positioned between these two metal layers.

Metallization layers of CMOS back-end may serve as bottom metal layers while the upper metal layer can be a subsequent metallization layer of CMOS or can be formed as a separate upper metal layer.

The capacitance of an MIM capacitor can be increased by using an insulator layer that is made of a high relative permittivity (dielectric constant) material (high k material). The quality of an insulator layer may be responsive to the smoothness and to the cleanliness of the bottom metal layer.

Trench (three dimensional) MIM capacitors better utilize the foot space of an integrated circuit allowing producing the capacitor with the maximum capacitance density but the manufacturing process of trench MIM capacitor encounters the reliability problems.

One of these problems is connected with the necessity of introducing a gap (or recess) between the upper edges of the bottom and the upper metal layers located in the trench. During the recess processing of a gap (or recess) the bottom metal layer of the trench MIM capacitor is exposed to aggressive etch treatment. This results in a rugged and unclean surface of the bottom metal layer and affects the insulator quality.

U.S. Pat. No. 6,436,787 of Wong-Cheng Shin et al. titled "Method of forming Crown-type MIM capacitor integrated with the Cu damascene process" describes a method for fabricating a three dimensional MIM capacitor in a copper damascene process. This MIM capacitor has no recess of any electrodes composing the stacked capacitor. As a result there are strong overshoots of the electric field at the device edge which limits the reliability performance of the device (the field is enhanced due to the electrode edge curvature effect and small distance between the electrodes).

U.S. Pat. No. 7,224,014 of Hideo Ichimura titled "Semiconductor device and method for fabricating the same" describes a method for fabricating a trench DRAM capacitor in an intermetal dielectric (IMD) module. This method suggests forming a recess of the lower polysilicon electrode. The recess of the polysilicon layer composing the lower electrode of the stacked trench capacitor is formed by anisotropic dry etching of a polysilicon layer using the resist in the trench as a mask. The deposition of the polysilicon layer is associated with high temperatures (about 640 Celsius) and may not be fitted for various manufacturing processes. This method does not allow the precise control of the penetration depth into the lower polysilicon layer in the process of the recess formation.

U.S. Pat. No. 7,927,959 of Steven J. Keating et al. titled "Method of patterning a metal on a vertical sidewall of excavated feature, method of forming an embedded MIM capacitor using same, and embedded memory device produced thereby" describes a method for fabricating MIM capacitor for the manufacturing eDRAM device. The method includes filling an excavated feature with a filling material such that a portion of the metal on vertical sidewalls (lower electrode) is exposed above the material. A first etch chemistry etches the exposed portion of the metal away and produces recess while a second wet etch chemistry removes the material from the excavated feature. This method suffers from lower electrode height variation (recess amount) which causes significant capacitance variation of the MIM capacitor. Furthermore, the surface of the lower electrode after the material removal requires an additional clean which further reduces the quality of the lower electrode interface with the further deposited dielectric layer. Accordingly—this process will result in a reduced reliability of the MIM capacitor.

There is a growing need to provide a reliable method for manufacturing high quality trench MIM capacitors.

SUMMARY

According to an embodiment of the invention there may be provided a method for manufacturing trench MIM capacitors.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIGS. 1, 2, 3, 4, 5, 6, 7A, 7B, 7C and 7D are cross sectional views of a portion of an integrated circuit and illustrates various manufacturing stages of a trench MIM manufacturing method according to an embodiment of the invention;

Figure 1:
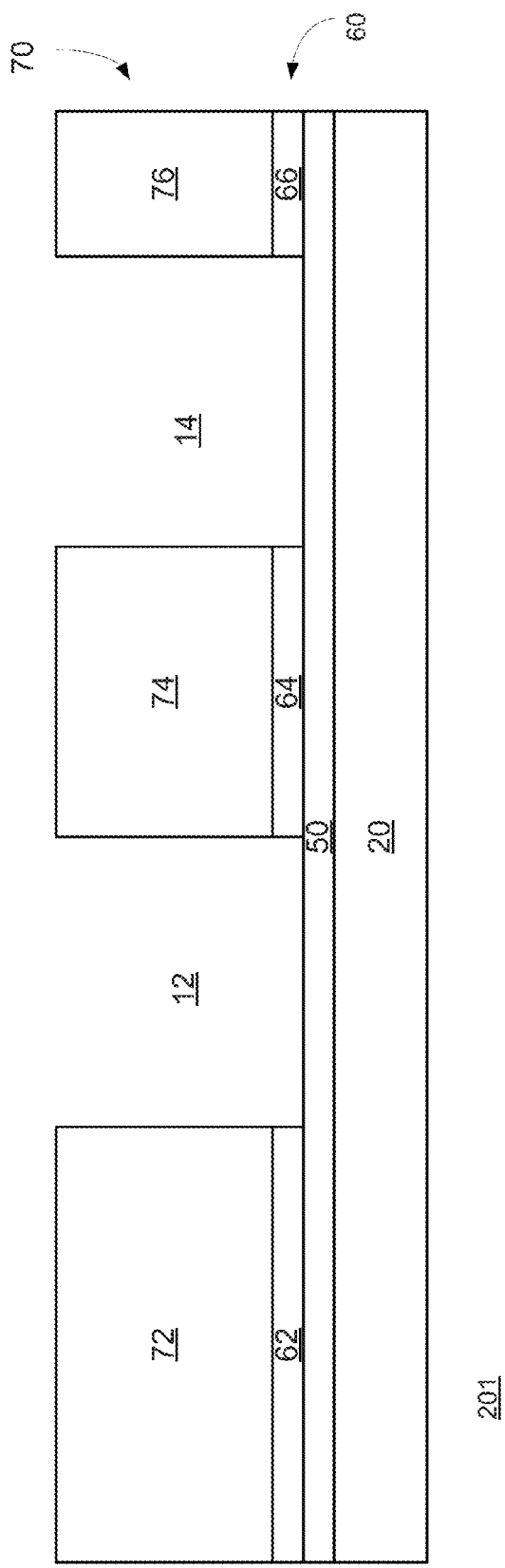

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DESCRIPTION OF THE PREFERRED EMBODIMENTS

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

There is provided a method for fabricating a high density trench MIM capacitor that includes a first metal layer, a second metal layer and an insulator layer that can be made of a high dielectric constant material.

According to an embodiment of the invention, the method includes introducing a gap (or recess) between the upper edges of the first metal layer and the second metal layer—which increases the reliability of the trench MIM capacitor.

The gap can be formed using a recess forming process. During the recess forming process a filling material that is deposited in the cavity may act as a mask that protects the first metal layer deposited at the bottom of the cavity.

The recess forming process is followed by a first removal process during which the filling material is removed from the cavity.

The first removal process could be aggressive since the sacrificial layer protects the first metal layer from damage.

The first removal process may be followed by a second removal process during which the sacrificial layer is removed.

The second removal process should be delicate to retain the surface of the first metal layer undamaged (clean and smooth) and thus be suitable for the following deposition of isolation layer.

According to an embodiment of the invention the manufacturing process may be implemented in CMOS manufacturing process, using CMOS manufacturing process and material.

Figure 16:
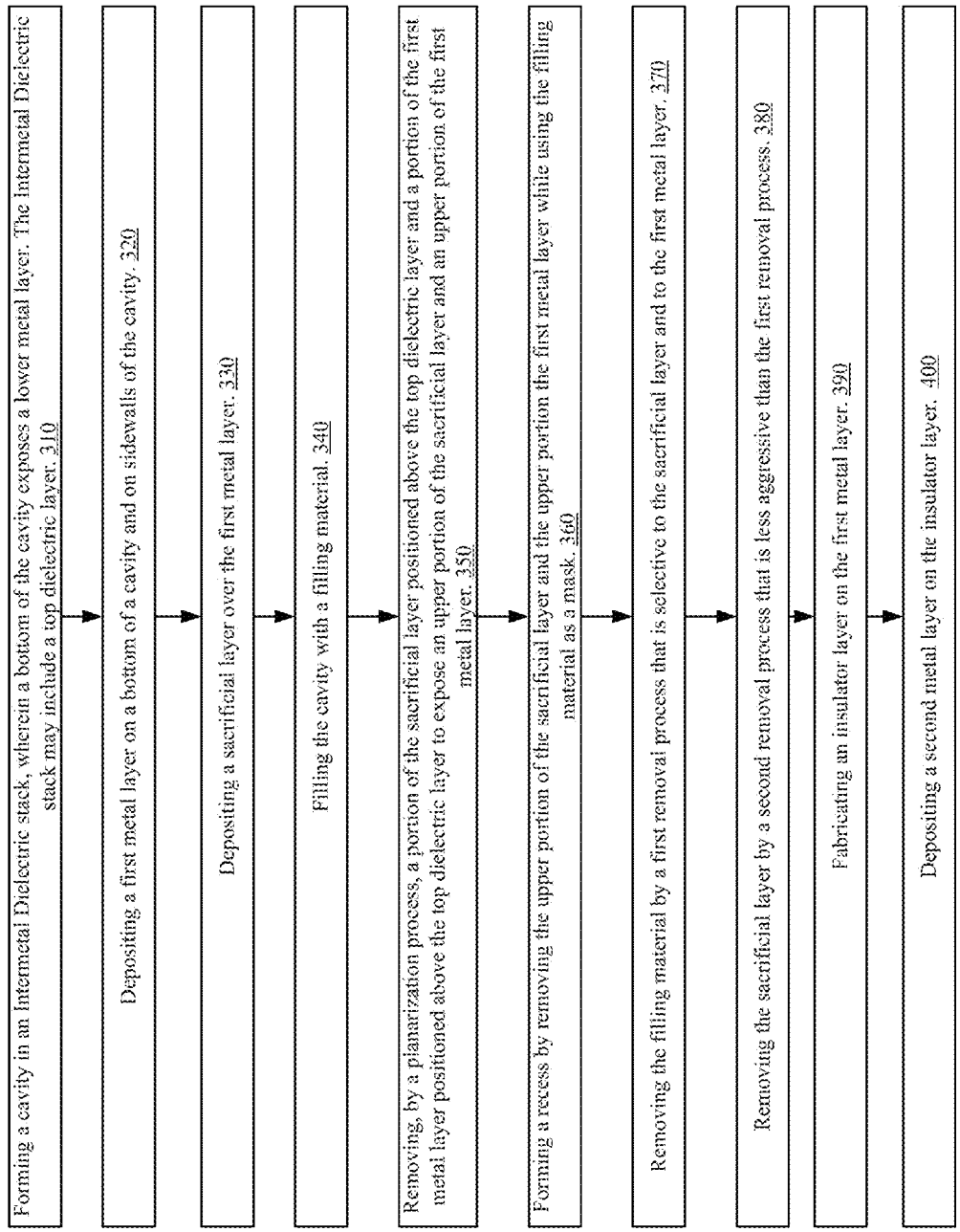
FIG. 16 illustrates a method according to an embodiment of the invention.

FIGS. 1, 2, 3, 4, 5, 6, 7A, 7B, 7C and 7D are cross sectional views of a portion of an integrated circuit and illustrates various manufacturing stages of a trench MIM manufacturing method 300 according to an embodiment of the invention. Method 300 is illustrated in FIG. 16.

The integrated circuit includes multiple layers. These layers may be deposited by different techniques, such as, physical vapor deposition (PVD), chemical vapor deposition (CVD) including atomic layer deposition method, evaporation, electroplating and the like. The thickness of each layer may be from several nanometers to several microns, as well.

FIG. 1 illustrates a cross section of a portion 201 of a semiconductor die.

Portion 201 may include a lower metal layer 50 that is positioned above the dielectric layer 20.

Portion 210 may also include cavities 12 and 14 that are formed in IMD (Inter Metal Dielectric) stack consisting of top dielectric layer (hereinafter top layer) 70 and etch-stop dielectric layer (hereinafter stop layer) 60 to provide stop layer segments 62, 64 and 66 and top layer segments 72, 74 and 76.

Lower metal layer 50 can be made of conductive materials such as but not limited to Titanium/Titanium Nitride and Aluminum.

Stop layer 60 can be made of a dielectric material such as but not limited to Silicon Nitride (SiN). Stop layer 60 can be used as a stop layer for dry etch.

Figure 2:
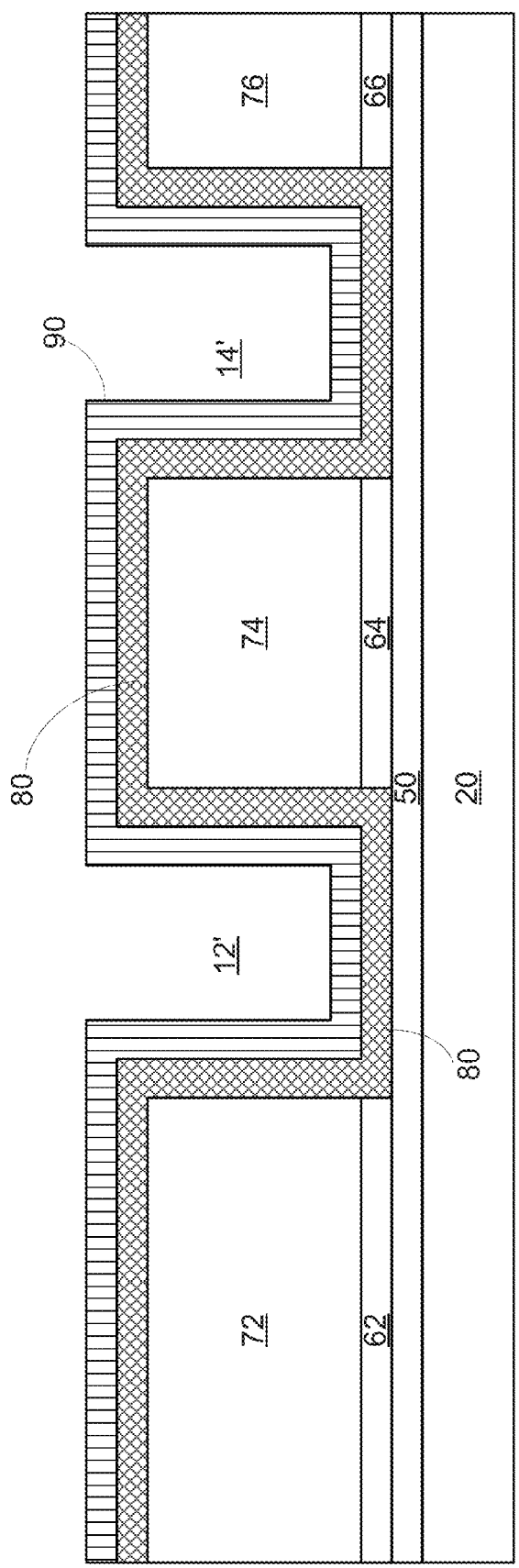

FIG. 2 illustrates a cross section of a portion 202 of a semiconductor die according to an embodiment of the invention.

Portion 202 is manufactured by the blanket depositing a first metal layer 80 on the bottom and sidewalls of cavities 12 and 14 and over the top layer 70 (top layer segments 72, 74 and 76).

The first metal layer 80 includes first metal layer bottoms (positioned on the bottom of cavities 12 and 14—lower metal layer 50), first metal layer top portions (positioned above top layer segments 72, 74 and 76) and first metal layer sidewalls (positioned on the sidewalls of cavities 12 and 14).

The deposition of the first metal layer 80 is followed by fabricating the sacrificial layer 90 on the first metal layer 80.

The sacrificial layer 90 includes sacrificial layer bottoms (positioned on the first metal layer bottoms), sacrificial layer top portions (positioned above top layer segments 72, 74 and 76) and sacrificial layer sidewalls (positioned on the first metal layer sidewalls).

The first metal layer 80 and the sacrificial layer 90 partially fill cavities 12 and 14.

It is desirable that each one of first metal layer 80 and sacrificial layer 90 would be conformal and smooth.

Figure 3:
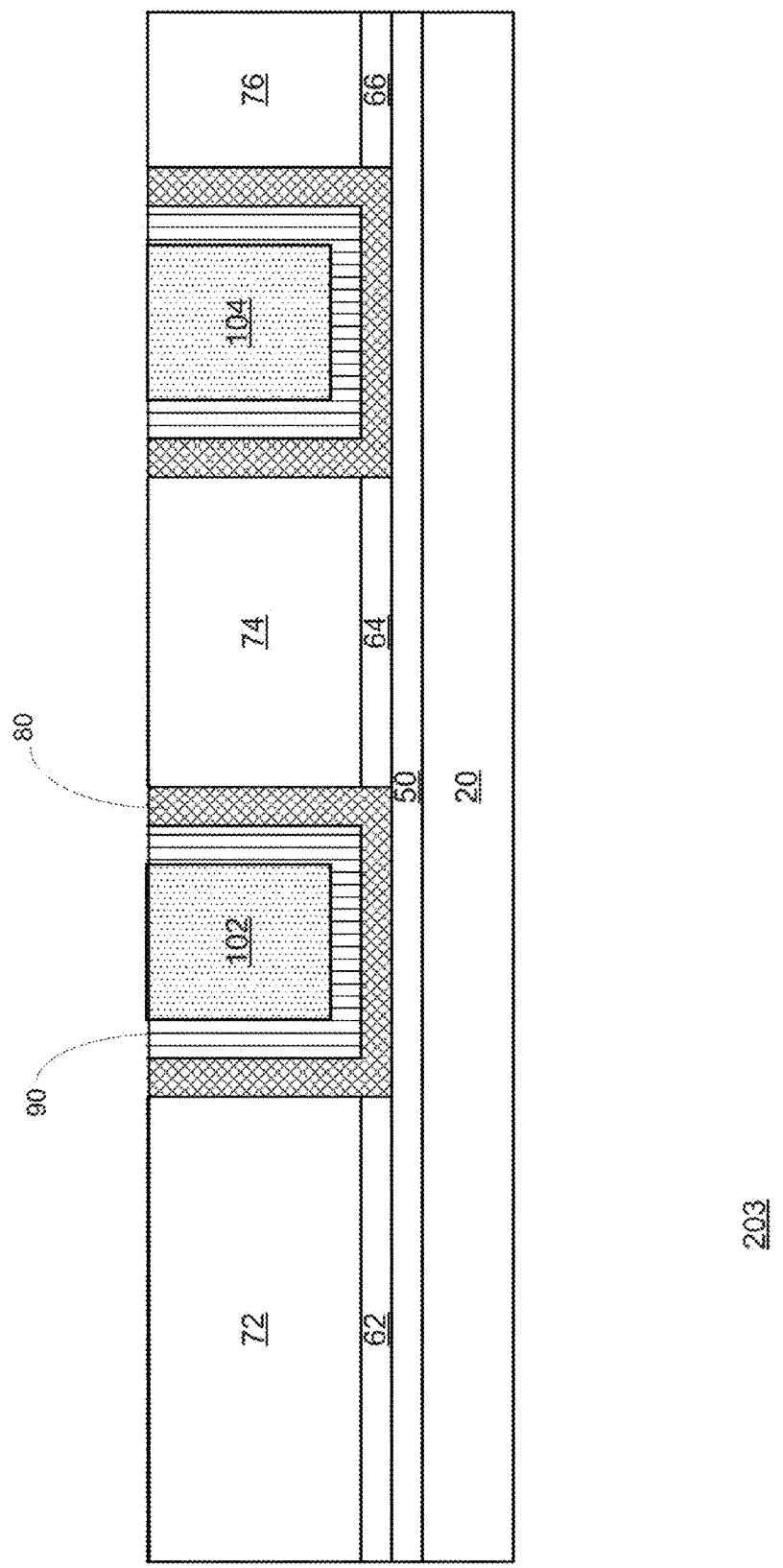

FIG. 3 illustrates a cross section of a portion 203 of a semiconductor die according to an embodiment of the invention.

Portion 203 is manufactured by filling cavities 12 and 14 with a filling material 102 and 104 and then applying a planarization process that removes at least the sacrificial layer portions and the first metal layer upper portions that were positioned above top layer 70. The planarization process may remove the upper portion of the cavities.

The planarization process does not affect the portions of the sacrificial layer and the first metal layers that maintain within the cavities.

The planarization process may include, for example, applying a Chemical Mechanical Polishing (CMP) technique.

The planarization process may be followed by a recess formation process.

Figure 4:
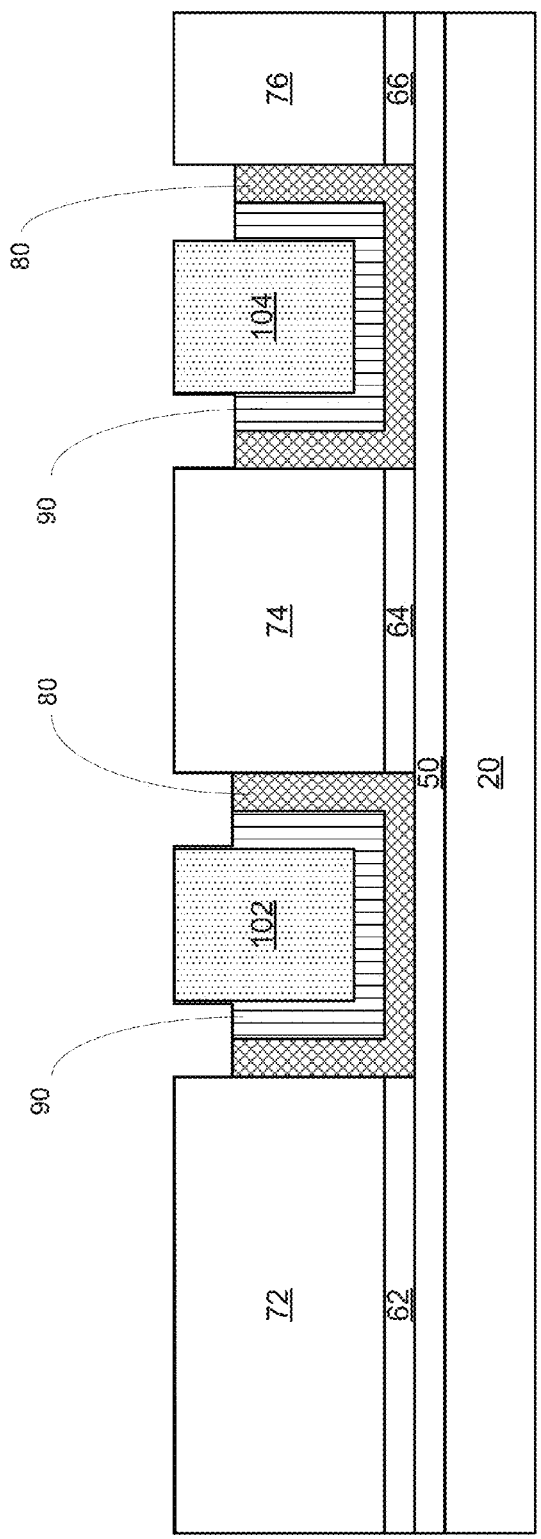

The filling material may be, for example, a photoresist, CVD Tungsten, spin-on glass or any material that can act as a mask during the recess formation process that forms portion 204 of FIG. 4 and is compatible with CMOS processing.

FIG. 4 illustrates a cross section of a portion 204 of a semiconductor die according to an embodiment of the invention.

Portion 204 is manufactured by forming a recess—by removing an upper portion of the sacrificial layer and an upper portion of the first metal layer while a filing material prevents a lower portion of the sacrificial and first metal layers from being removed by the recess forming process.

The recess forming process is followed by a first removal process (in which filling material 102 and 104 is removed) and by a second removal process (in which the sacrificial layer is removed).

Figure 5:
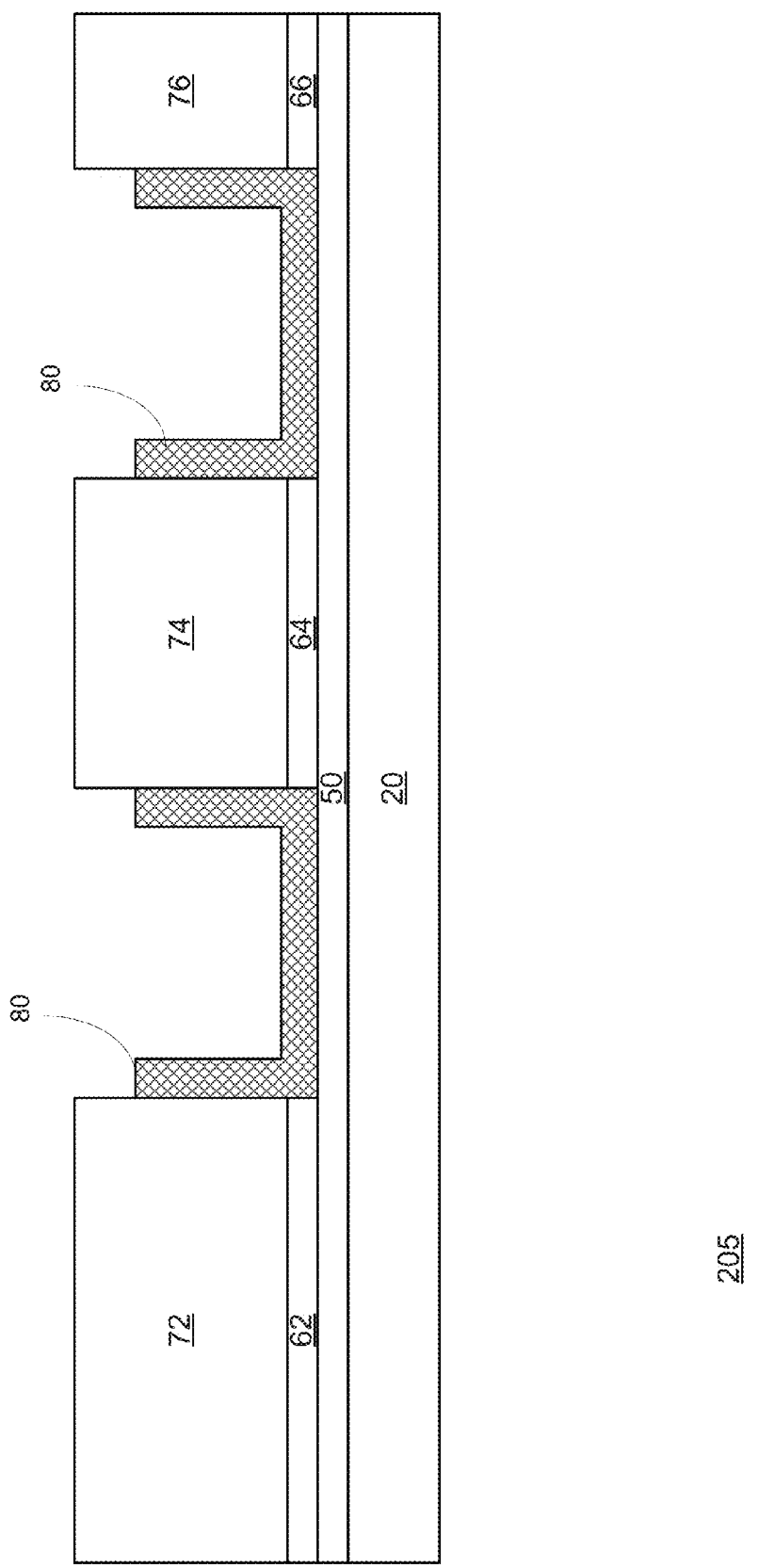

FIG. 5 illustrates a cross section of a portion 205 of a semiconductor die according to an embodiment of the invention.

Portion 205 is manufactured by applying the first and second removal processes.

Due to presence of the sacrificial layer, the first removal process may be more aggressive than the second removal process.

The first removal process should have selectivity to the sacrificial layer material as well as the second removal process to the first metal layer. Meanwhile the second removal process is less aggressive. Accordingly—at the end of the second removal process the first metal layer is exposed and an exposed surface of the first metal layer is clean from the process by-products, smooth and thus optimized for the isolating layer deposition.

Figure 6:
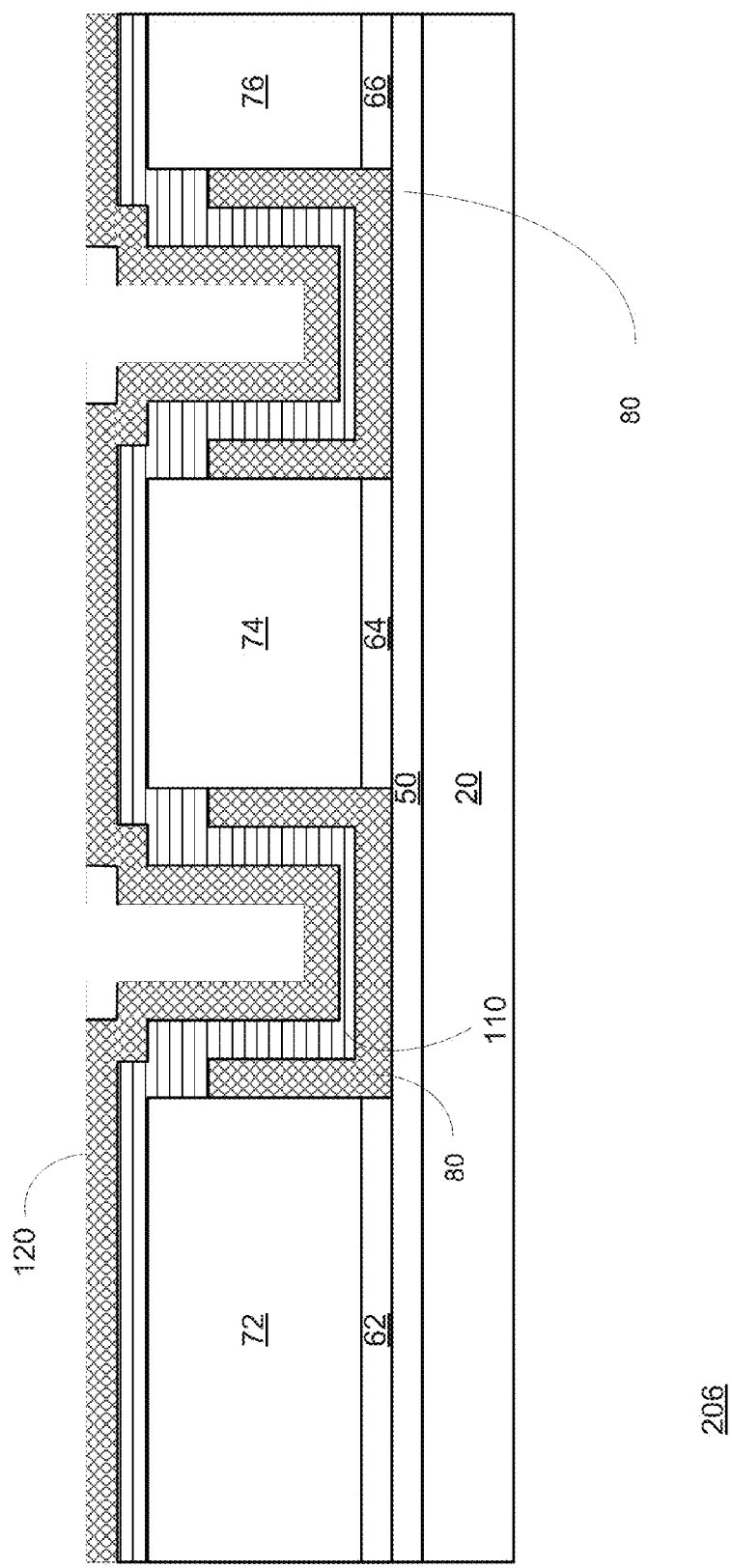

FIG. 6 illustrates a cross section of a portion 206 of a semiconductor die according to an embodiment of the invention.

Portion 206 is manufactured by fabricating an insulator layer 110 on first metal layer 80 and depositing a second metal layer 120 on the insulator layer 110 thereby forming a trench MIM capacitor.

First metal layer 80 and lower metal layer 50 may form the bottom metal layer (bottom electrode) of the trench MIM capacitor.

The insulator layer 110 fills a gap (recess) formed by the removal of the upper portion of the first metal layer (see FIG. 4).

The insulator layer 110 should be conformal and smooth as much as possible. Such requirements are best satisfied by the ALD deposition technique.

Figure 7A:
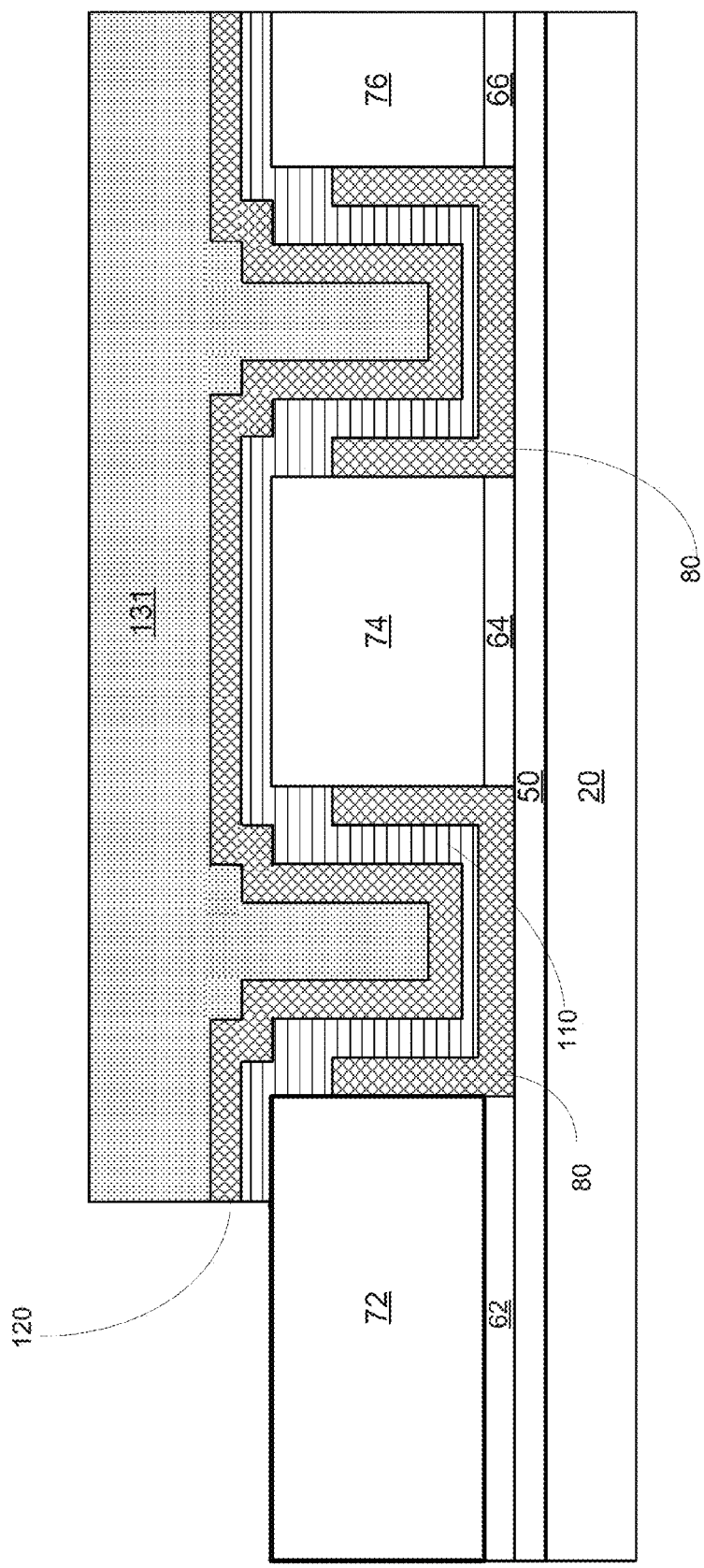

FIG. 7A illustrates a cross section of a portion 207A of a semiconductor die according to an embodiment of the invention.

Portion 207A is manufactured by: (a) depositing a photoresists layer 131 above the second metal layer 120 thereby filling cavities 12 and 14; (b) defining the MIM capacitor area by PR pattern; (c) removing a portion of the second metal layer 120 and a portion of the insulating layer 110 that were positioned above a portion of the top layer segment 72.

FIG. 7B illustrates a cross section of a portion 207B of a semiconductor die according to an embodiment of the invention.

Portion 207B is manufactured by: (a) stripping the photoresist layer 131, (b) depositing and patterning of photoresist layer 133, (c) forming a hole 143 that reaches the lower metal layer 50 (thereby contacting the bottom electrode of the trench MIM capacitor). The next operations may be performed according to conventional CMOS technology process. Some examples are listed below.

Figure 7C:
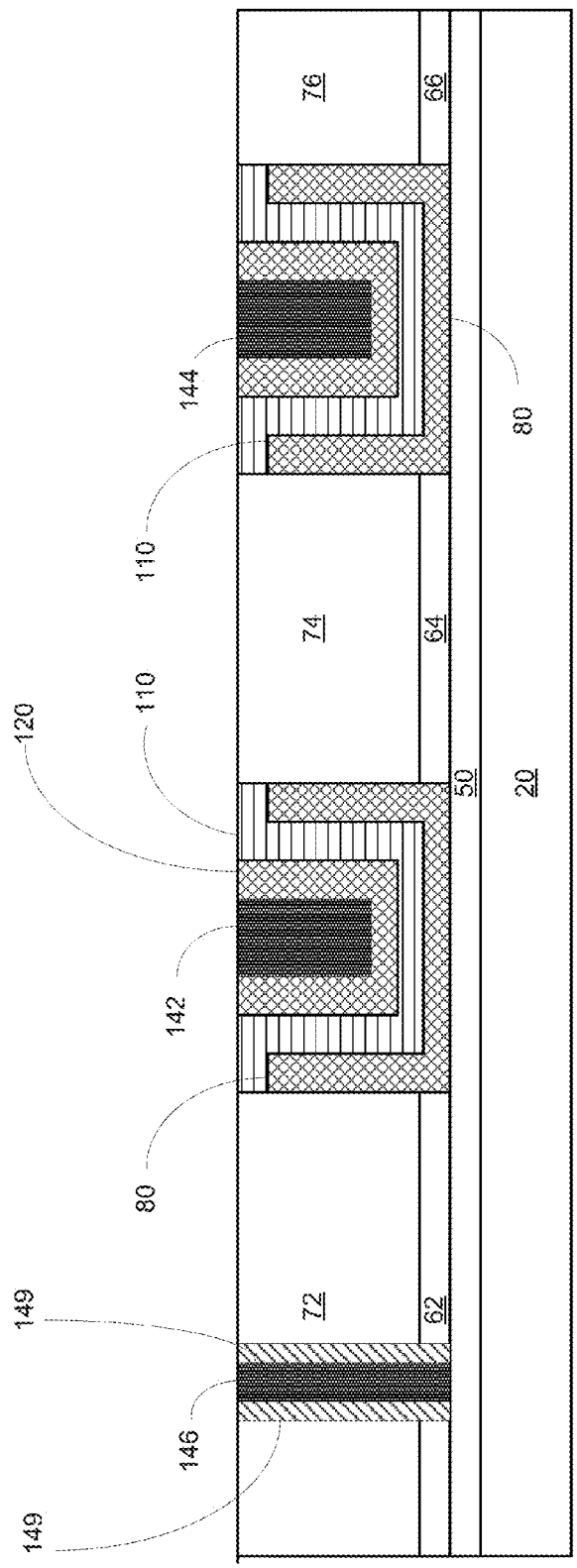

FIG. 7C illustrates a cross section of a portion 207C of a semiconductor die according to an embodiment of the invention.

Portion 207C is manufactured by (a) stripping the photoresist layer 133, (b) the deposition of the conductive barrier stack (also referred to liner 149) which may be as an example from TiN/Ti materials, that covers the bottom and the sidewalls of hole 143 and cavities (denoted 12' and 14' in FIG. 2), (c) filling the cavities (denoted 12' and 14' in FIG. 2) with a conductive material (such as Tungsten) to provide conductive elements (metal plugs or vias) 142 and 144, as well as filling the hole 143 to fabricate the conductive via 146, and (d) performing a leveling operation (CMP) that exposes the top of top layer segments 72, 74 and 74.

The second metal layer 120 and each one of conductive elements (vias) 142 and 144 may form the top metal layer (top electrode) of the trench MIM capacitor.

Figure 7D:
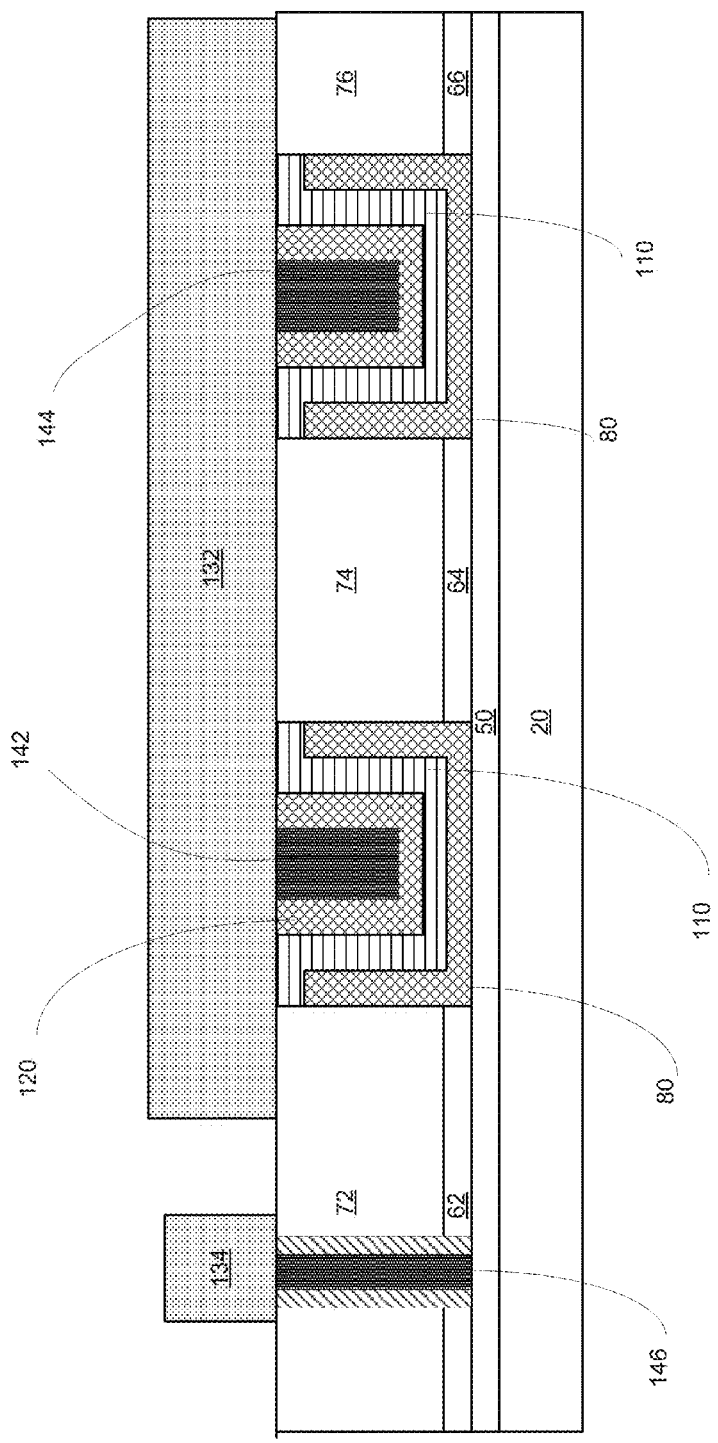

FIG. 7D illustrates a cross section of a portion 207D of a semiconductor die according to an embodiment of the invention.

Portion 207D is manufactured by metal stack deposition, its pattern and forming the metal connections to the bottom electrode and upper electrode of the of trench MIM capacitor. Via 146 is coupled to the bottom electrode of the trench MIM capacitor.

Conductive elements 142 and 144 are electrically coupled (in parallel to each other) by metal layer 132. Via 146 is coupled to metal layer 134.

This is the final stage of the trench capacitor fabrication. This fabrication requires one additional mask compared with the conventional planar MIM capacitor.

FIGS. 8, 9, 10, 11, 12, 13 and 13B are cross sectional views of a portion of an integrated circuit, these figures illustrate various manufacturing stages of a trench MIM manufacturing method 300 according to another embodiment of the invention. Method 300 is illustrated in FIG. 16.

Figure 8:
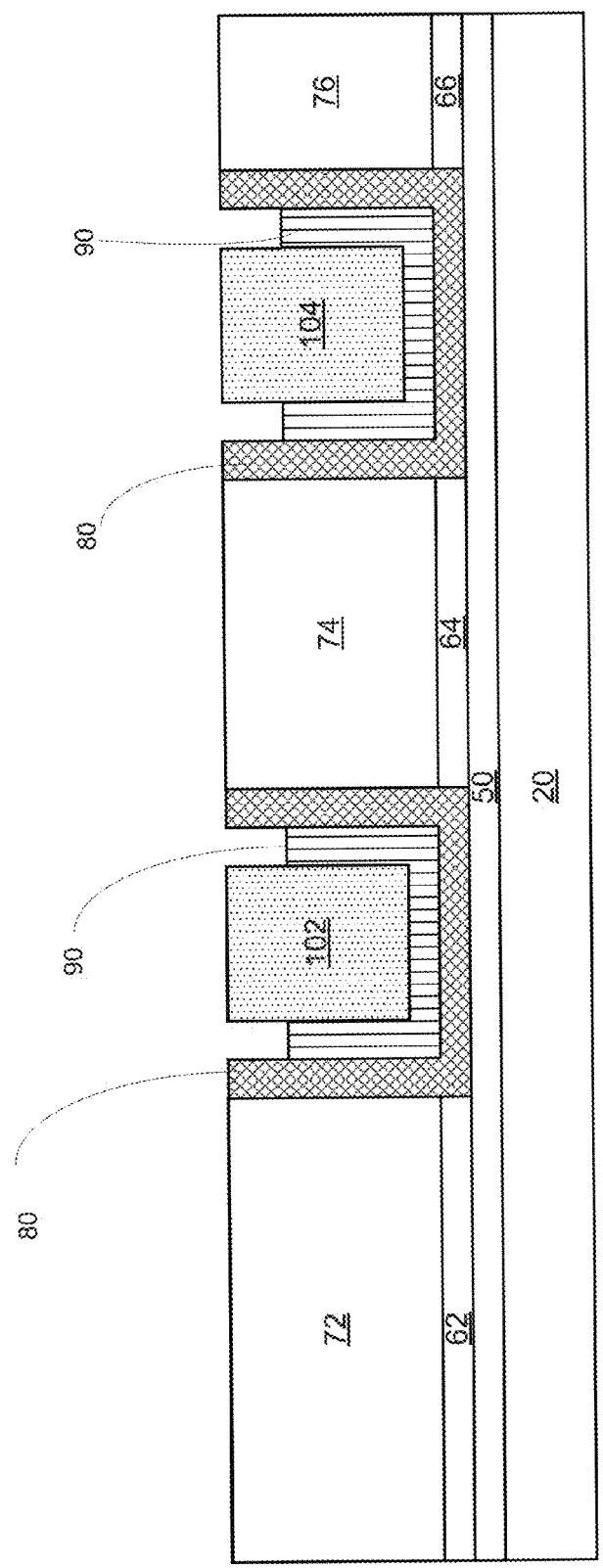
FIGS. 8, 9, 10, 11, 12, 13A and 13B are cross sectional views of a portion of an integrated circuit and illustrates various manufacturing stages of a trench MIM manufacturing method according to another embodiment of the invention.

Portion 208 of FIG. 8 may be manufactured by removing an upper portion of the sacrificial layer by a first recess forming process while the filling material prevents a bottom of the sacrificial layer from being removed by the first recess forming process.

Portion 208 of FIG. 8 differs from portion 204 of FIG. 4 by not removing the upper portion of first metal layer 80.

Figure 9:
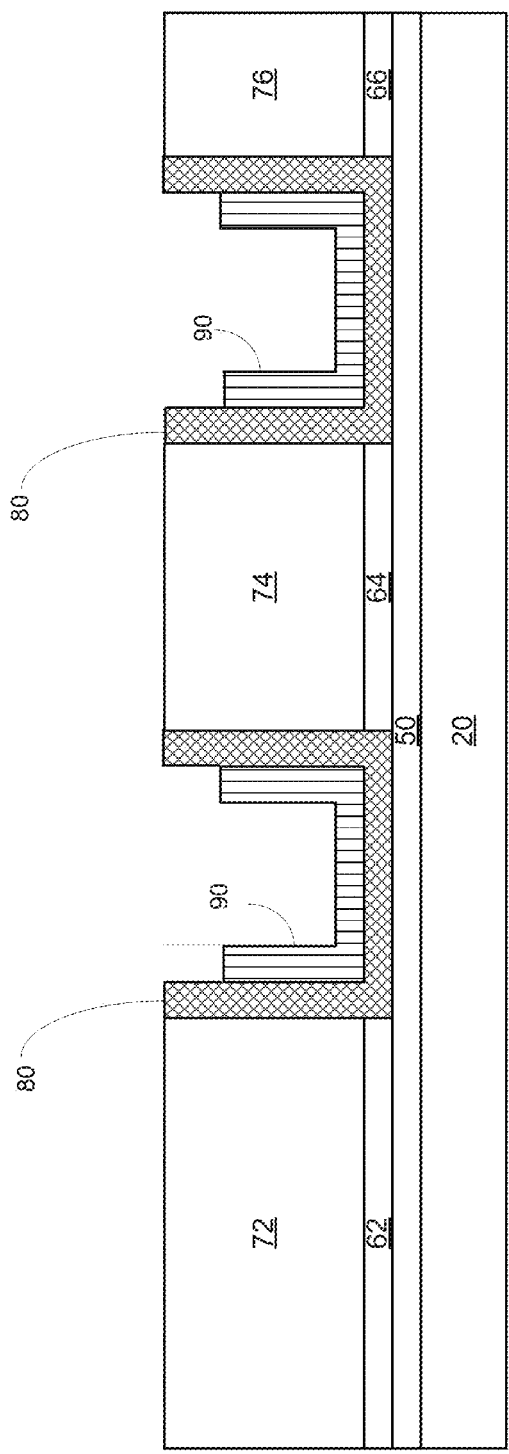

FIG. 9 illustrates a cross section of a portion 209 of a semiconductor die according to an embodiment of the invention.

Portion 209 is manufactured by removing filling material 102 and 104 by the first removal process—that is selective to first metal layer 80 and to sacrificial layer 90.

Figure 10:
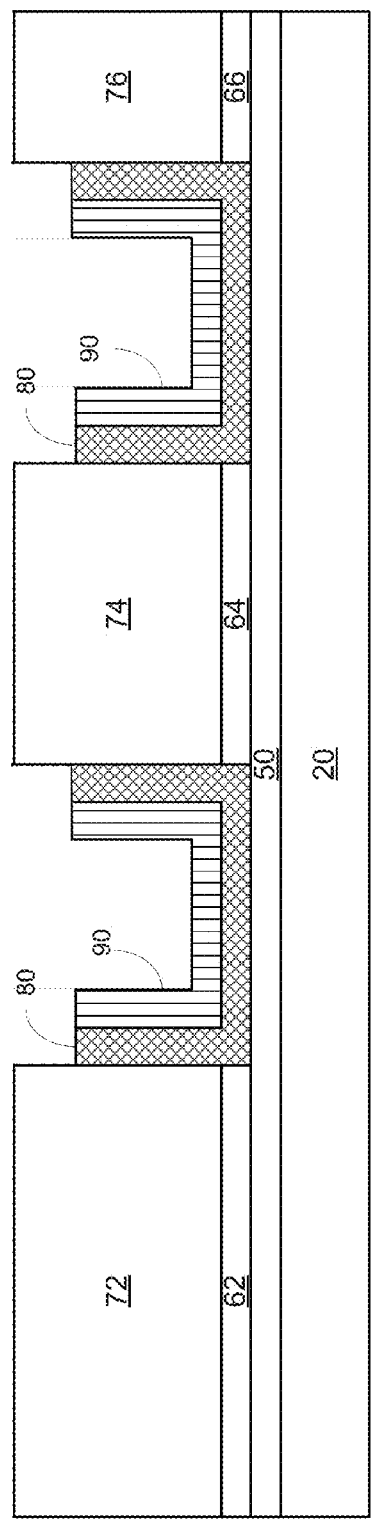

FIG. 10 illustrates a cross section of a portion 210 of a semiconductor die according to an embodiment of the invention.

Portion 210 is manufactured by removing an upper portion of the first metal layer 80 by a second recess removal process. The sacrificial layer 90 acts as a mask.

Figure 11:
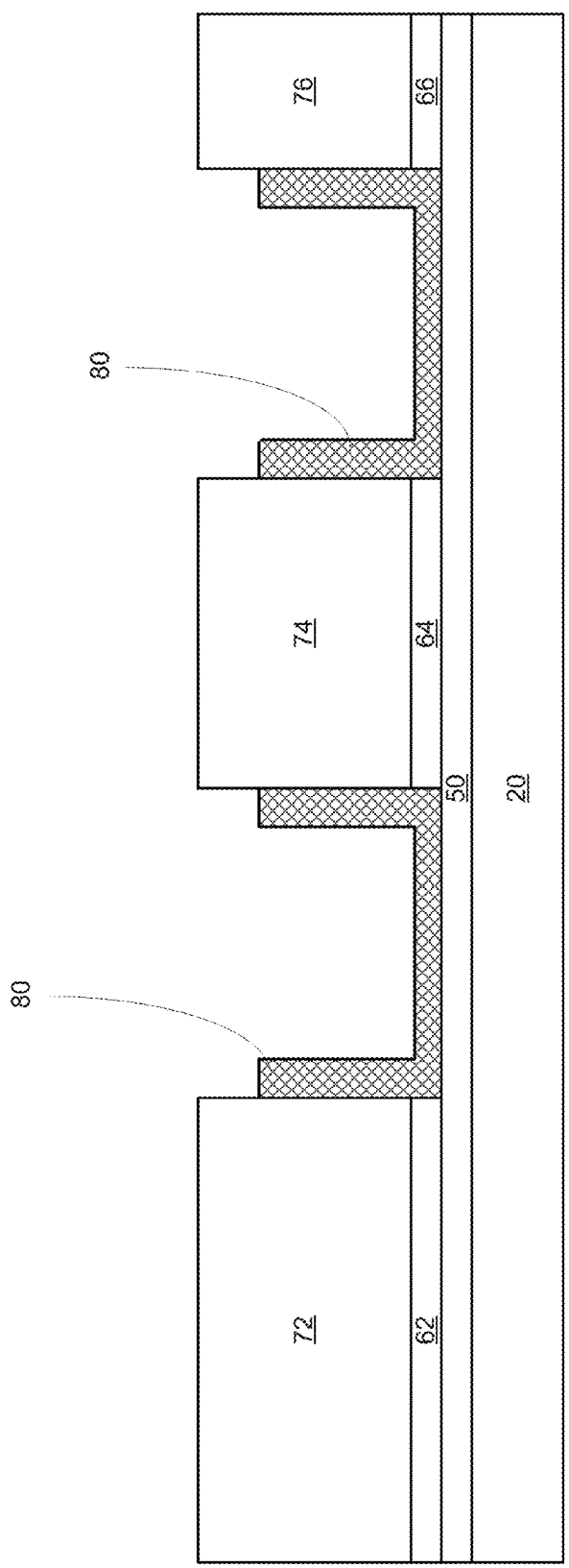

FIG. 11 illustrates a cross section of a portion 211 of a semiconductor die according to an embodiment of the invention.

Portion 211 is manufactured by removing the sacrificial layer 90 by a second removal process—that may be selective etch to the first metal layer 80.

Figure 12:
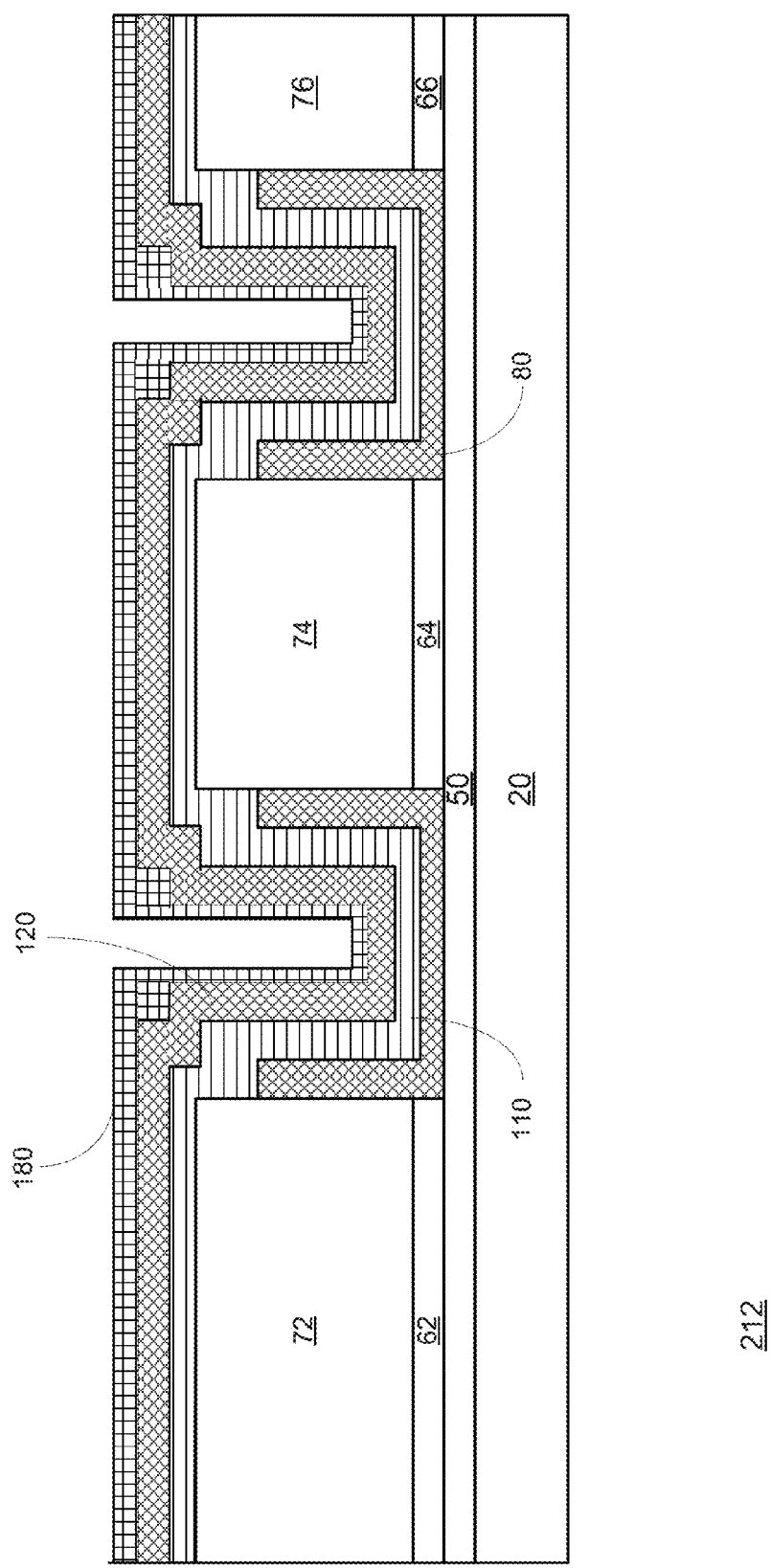

FIG. 12 illustrates a cross section of a portion 212 of a semiconductor die according to an embodiment of the invention.

Portion 212 is manufactured by fabricating an insulator layer 110 on first metal layer 80 and depositing a second metal layer 120 on the insulator layer 110 thereby forming the structure of the trench MIM capacitors between first metal layer 80 and the second metal layer 120 and also depositing a protective dielectric layer 180 on top of the second metal layer 120. The protective dielectric layer 180, made as an example from SiN, is used also as an etch stop layer during a via fabrication step. Moreover, it protects the capacitor from the plasma induced damage during the photoresist (PR) strip.

Figure 13A:
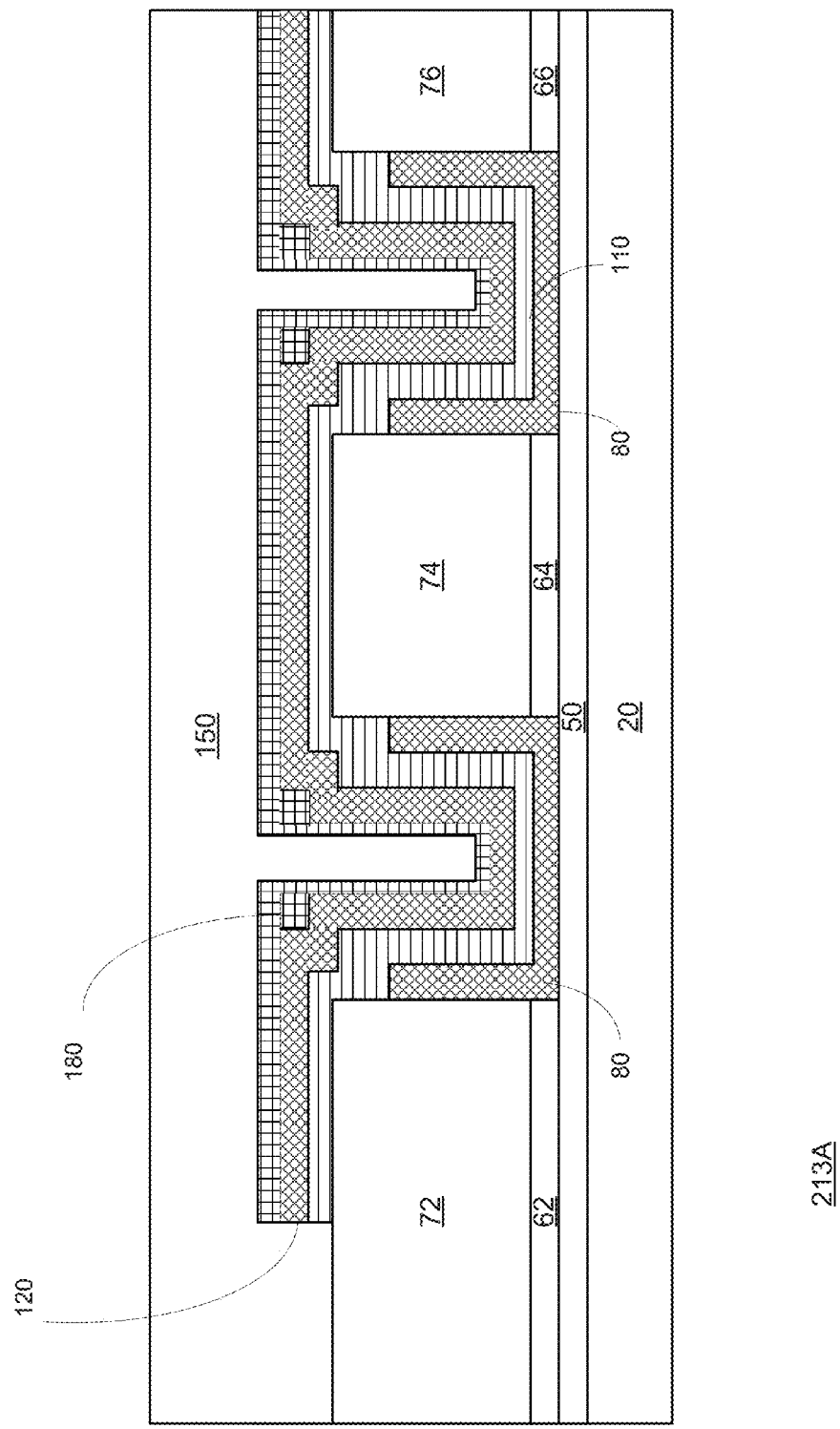

FIG. 13A illustrates a cross section of a portion 213A of a semiconductor die according to an embodiment of the invention.

Portion 213A is manufactured by: (a) depositing the PR layer and its patterning; (b) etching layers 180, 120, and 110 up to the top layer segment 72 (IMD dielectric) and defining the area of the trench MIM capacitor; (c) removing the photoresist and depositing the additional dielectric layer 150 that fills the cavities 12' and 14', and (d) the leveling (planarization) of the additional dielectric layer 150 by CMP. The process may proceed according to any known CMOS manufacturing process. Some examples are listed below.

Figure 13B:
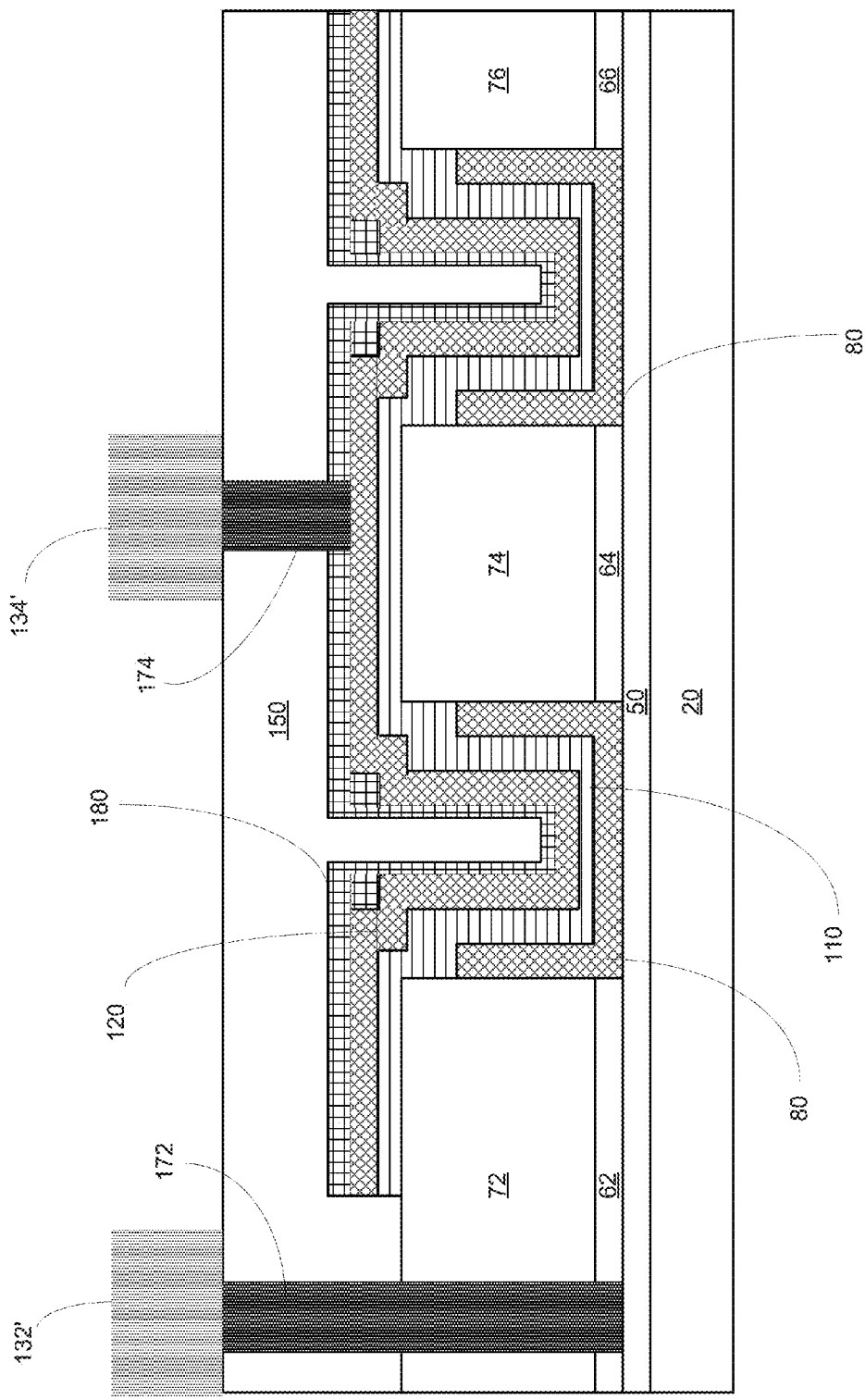

FIG. 13B illustrates a cross section of a portion 213B of a semiconductor die according to an embodiment of the invention.

In FIG. 13B the second metal layer 120 may form the top metal layer (top electrode) of the trench MIM capacitor. The first metal layer 80 and lower metal layer 50 may form the bottom metal layer (bottom electrode) of the trench MIM capacitor.

Portion 213B is manufactured by: (a) forming opens for first via 172 and second via 174 (layers 180 and 120 act as a dry etch stop due to a different leveling of the layers 110 and 50), (b) conductive barrier stack (TiN/Ti is an example) deposition and filling the opens with conductive material (tungsten as an example) to form first via 172 and second via 174; (c) tungsten planarization with the forming of the first and second vias 172 and 174—to the bottom electrode (first via 172) and upper (second via 174) electrodes of the MIM capacitor; (d) Upper metal stack deposition and following pattern to form connection to lower metal layer 50 (through metal 132' and first via 172) and to second metal layer 120 (through metal 134' and second via 174).

First via 172 is electrically coupled to the lower metal layer 50 and thereby contacts the bottom electrode of the trench MIM capacitor. Second via 174 is electrically coupled to second metal layer 120 and thereby contacts the top electrode of the trench MIM capacitor.

Figure 14:
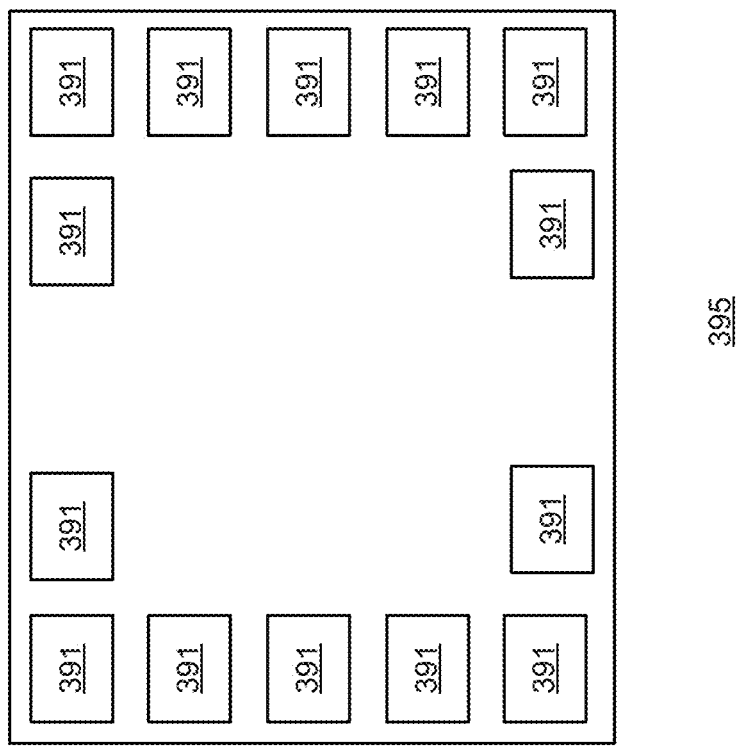
FIG. 14 illustrates a pixel that includes a trench MIM capacitor according to an embodiment of the invention.

FIG. 14 illustrates a pixel 395 according to an embodiment of the invention. Pixel 395 includes multiple trench structures 391 when each of them is capacitor. The multiple capacitors may be coupled to each other in various manners. For this specific case, the capacitors are coupled to each other in parallel in order to obtain the maximum possible capacitance needed for storing and reading the data from a pixel.

Figure 15:
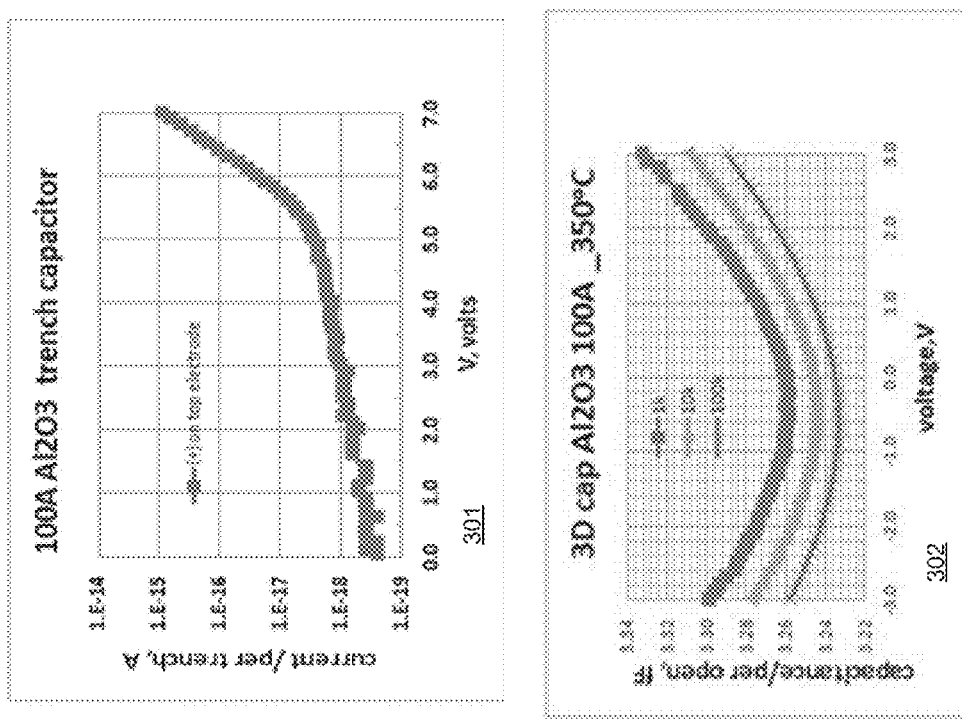
FIG. 15 illustrates the electrical characteristics of a trench MIM capacitor according to an embodiment of the invention.

FIG. 15 illustrates electrical characteristics of a trench MIM capacitor according to an embodiment of the invention.

The tested trench MIM capacitor included a 100 A thick alumina dielectric layer. Each capacitor include 7500 trenches that are connected in parallel. The tested trench MIM capacitor has a low frequency dispersion (graph 302 of FIG. 15 illustrates measurements up to 100 kHz) which indicates low series resistances of the electrodes. The capacitance per trench exceeds 3 fF. The capacitor leakage current (per trench) at 2.5V (requested operation voltage) shown in graph 301 of FIG. 15 is an order of magnitude lower than the required limit.

FIG. 16 illustrates method 300 according to an embodiment of the invention.

Method 300 may start by step 310 of forming a cavity in an Intermetal Dielectric stack, wherein a bottom of the cavity exposes a lower metal layer. The Intermetal Dielectric stack may include a top dielectric layer.

Step 310 may be followed by step 320 of depositing a first metal layer on a bottom of a cavity and on sidewalls of the cavity.

Step 320 may be followed by step 330 of depositing a sacrificial layer over the first metal layer.

Step 330 may be followed by step 340 of filling the cavity with a filling material.

Step 340 may be followed by step 350 of removing, by a planarization process, a portion of the sacrificial layer positioned above the top dielectric layer and a portion of the first metal layer positioned above the top dielectric layer to expose an upper portion of the sacrificial layer and an upper portion of the first metal layer.

Step 350 may be followed by step 360 of forming a recess by removing the upper portion of the sacrificial layer and the upper portion the first metal layer while using the filling material as a mask.

Step 360 may be followed by step 370 of removing the filling material by a first removal process that is selective to the sacrificial layer and to the first metal layer.

Step 370 may be followed by step 380 of removing the sacrificial layer by a second removal process that is less aggressive than the first removal process and selective to the first metal layer.

Step 380 may be followed by step 390 of fabricating an insulator layer on the first metal layer.

Step 390 may be followed by step 400 of depositing a second metal layer on the insulator layer.

Method 300 of FIG. 16 can include manufacturing steps that are associated with a range of temperatures. For example, method 300 may use include only "cold" manufacturing steps—manufacturing steps that are not associated with temperatures above a temperature threshold. For example—method 300 may not include poly-silicon deposition processes that involve high temperatures (such as 640 degrees Celsius).

Any reference to any of the terms "comprise", "comprises", "comprising" "including", "may include" and "includes" may be applied to any of the terms "consists", "consisting", "consisting essentially of". For example—any of the rectifying circuits illustrated in any figure may include more components that those illustrated in the figure, only the components illustrated in the figure or substantially only the components illustrate din the figure.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A method for manufacturing a metal insulator metal (MIM) trench capacitor, the method comprising:
    forming a cavity in an intermetal dielectric stack, wherein a bottom of the cavity exposes a lower metal layer; wherein the intermetal dielectric stack comprises a top dielectric layer; wherein the cavity is positioned between top dielectric layer segments of the top dielectric layer;
    depositing a first metal layer on a bottom of the cavity, on sidewalls of the cavity and on the top dielectric layer segments;
    depositing a sacrificial layer over the first metal layer;
    filling the cavity with a filling material;
    removing, by a planarization process, a portion of the sacrificial layer that is positioned above the top dielectric layer segments and a portion of the first metal layer that is positioned above the top dielectric layer segments, to expose an upper portion of the sacrificial layer and an upper portion of the first metal layer;
    forming a recess by removing the upper portion of the sacrificial layer and the upper portion the first metal layer while using the filling material as a mask;
    removing the filling material by a first removal process that is selective to the sacrificial layer and to the first metal layer;
    removing the sacrificial layer by a second removal process that is selective to the first metal layer;
    fabricating an insulator layer on the first metal layer; and
    depositing a second metal layer on the insulator layer.

2. The method according to claim 1 wherein a thickness of the sacrificial layer ranges between 50 Angstrom and 200 Angstrom.

3. The method of claim 1, wherein a thickness of the first metal layer ranges between 50-1000 A.

4. The method of claim 1, wherein the first metal layer is made of at least one out of Ti, TiN, Ta, TaN and Co.

5. The method of claim 1 wherein the forming of the recess comprises removing the upper portion of the sacrificial layer and the upper portion the first metal layer simultaneously.

6. The method of claim 1 wherein the forming of the recess comprises (a) removing the upper portion of the sacrificial layer, and (b) removing the upper portion of the first metal layer after a completion of the removing of the upper portion of the sacrificial layer.

7. The method according to claim 1 wherein the second removal process is a wet etch process.

8. The method according to claim 1 wherein the planarization process is selected from a group consisting of a wet etch process, a dry etch process and a chemical mechanical planarization process.

9. The method according to claim 1 wherein the filling material is tungsten.

10. The method according to claim 1 wherein the filling material is a photoresist.

11. The method according to claim 1 wherein the filling material is spin-on glass.

12. The method according to claim 1 wherein the sacrificial layer is made of silicon nitride.

13. The method according to claim 1 wherein the forming of the recess comprises preventing, by the filling material, a removal of the lower portion of the sacrificial and the first metal layer from being removed.

14. The method according to claim 1 wherein the forming of the recess comprises maintaining the filling material unchanged during the forming of the recess.

15. The method according to claim 1 wherein the second removal process is less aggressive than the first removal process.

* * * * *